April 29, 1969 HIRO MORIYASU 3,441,863

DRIFT COMPENSATED DIRECT COUPLED AMPLIFIER CIRCUIT HAVING ADJUSTABLE D.C. OUTPUT VOLTAGE LEVEL

Filed Aug. 2, 1965

HIRO MORIYASU
INVENTOR

BY
BUCKHORN, BLORE, KLARQUIST & SPARKMAN
ATTORNEYS 3,441,863
Patented Apr. 29, 1969

3,441,863
DRIFT COMPENSATED DIRECT COUPLED AMPLIFIER CIRCUIT HAVING ADJUSTABLE D.C. OUTPUT VOLTAGE LEVEL

Hiro Moriyasu, Portland, Oreg., assignor to Tektronix, Inc., Beaverton, Oreg., a corporation of Oregon Filed Aug. 2, 1965, Ser. No. 476,542
Int. Cl. H03f 1/02
U.S. Cl. 330—9 8 Claims

ABSTRACT OF THE DISCLOSURE

A direct coupled amplifier circuit is described which is compensated to prevent drift in its D.C. output voltage level, and is provided with a level control for adjusting such output voltage level. The amplifier circuit includes a pair of amplifier stages with the level control connected to the input of the second stage and a bipolar D.C. feedback circuit connected between the output of the second stage to the input of the first stage to provide negative feedback. A voltage comparator is connected in the feedback circuit with one input connected to the output of the second amplifier stage and another input connected to the level control, and produces a difference signal output which is applied to the input of the first amplifier as the negative feedback signal. This negative feedback difference signal cancels drift without canceling level control adjustments in the D.C. output voltage level of such amplifier.

Figure 1:
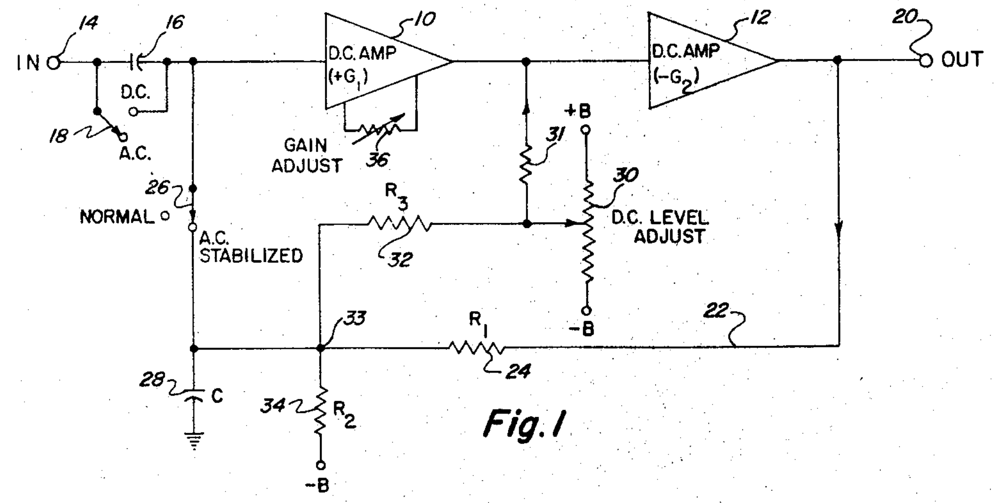

The subject matter of the present invention relates generally to direct coupled amplifier circuits whose D.C. output voltage levels tend to drift with temperature changes, aging, and gain adjustments, and in particular to a direct coupled amplifier circuit which is compensated to eliminate such drift and is also provided with a means for adjusting the D.C. output voltage level of such amplifier to different predetermined values, such adjustments in output voltage not being canceled by such drift compensation.

The drift compensated amplifier circuit of the present invention is especially useful when employed as the vertical amplifier of a cathode ray oscilloscope having a broad band frequency response from D.C. to several megacycles per second. Previously an A.C. coupling capacitor has been provided at the input of the D.C. amplifier used in the vertical deflection system of the oscilloscope to prevent any D.C. component of the input signal voltage from being transmitted through such amplifier. However, the internal drift of such amplifier, due to changes in temperature or aging, still causes a variation in the D.C. output voltage level of such amplifier which moves the vertical position of the trace on the fluorescent screen of the cathode ray tube used in such oscilloscope. In addition, in previous circuits variation of the gain of the amplifier sometimes also results in shift in the D.C. output voltage level of the amplifier which is caused by a flow of D.C. current through the gain adjustment resistance which may be due to an imbalance in a push-pull amplifier. When the amplifier has a high gain this shift in D.C. output level can be considerable, so that frequent adjustment of the D.C. balance control is necessary. Both of the above conditions are prevented in the amplifier circuit of the present invention and the term "drift," as used in the present application, refers to changes in D.C. output voltage level due to either of these causes.

Previous drift compensated direct coupled amplifiers have not been widely adopted as the vertical amplifier circuits of oscilloscopes because they do not enable adjustment in the positioning of the trace on the fluorescent screen of the cathode ray tube employed in such oscilloscope. These previous drift compensated amplifiers employ negative feedback to cancel any drift voltage, but such negative feedback also cancels any change in positioning voltage so that the trace is alwys centered on the fluorescent screen and cannot be moved to different positions on such screen. The drift compensated amplifier of the present invention overcomes this problem by employing a comparator circuit which compares the output voltage of the positioning adjustment means with the D.C. output voltage of the amplifier circuit to produce a difference voltage which is fed back to the input of such amplifier circuit to cancel only the drift voltage without canceling the positioning adjustment voltage in such output voltage. In addition, the drift compensation circuit of the present invention enables the amplifier circuit to operate near the center of its operating characteristic to provide greater linearity and a better high frequency response.

It is therefore one object of the present invention to provide an improved direct coupled amplifier circuit which is compensated to prevent any drift in its D.C. output voltage while enabling such output voltage to be adjusted to different levels.

Another object of the present invention is to provide an improved direct coupled amplifier circuit which is compensated to prevent any drift in its D.C. output voltage level while providing a more linear response over a wide frequency range in a simple and inexpensive manner.

A further object of the invention is to provide an improved drift compensated, direct coupled amplifier circuit having negative D.C. voltage feedback, which employs a comparator circuit to provide D.C. drift correction without canceling D.C. level adjustment voltages.

An additional object of the present invention is to provide an improved vertical amplifier circuit for the cathode ray oscilloscope which is drift compensated to provide a stable trace on the oscilloscope screen while enabling vertical positioning adjustment of such trace and to provide such amplifier with a wide band frequency response from D.C. up to several megacycles per second.

Figure 2:
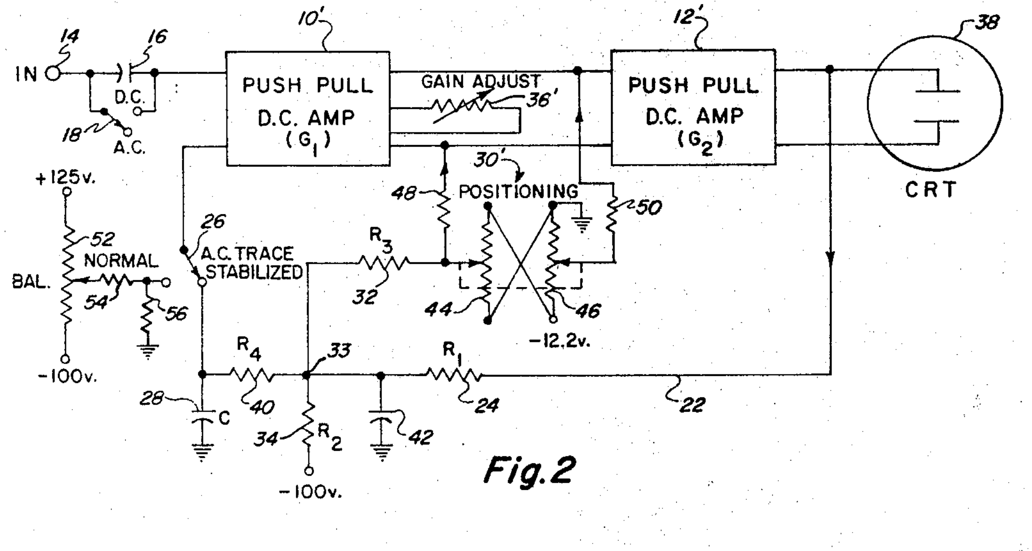

Other objects and advantages of the present invention will be apparent from the following detailed description of preferred embodiments thereof and from the attached drawings of which:

FIG. 1 shows a schematic diagram of a drift compensated, direct coupled amplifier circuit of the single ended type in accordance with one embodiment of the present invention; and FIG. 2 shows a drift compensated, direct coupled amplifier of the push-pull type in accordance with another embodiment of the present invention.

As shown in FIG. 1, one embodiment of the amplifier circuit of the present invention includes a pair of direct coupled, single ended amplifiers 10 and 12 with the output of amplifier 10 connected to the input of amplifier 12 and amplifier 12 being of the phase inverter type. The input of amplifier 10 is connected to a signal input terminal 14 either through an A.C. coupling capacitor 16 or directly through a switch 18 connected across such capacitor in the closed or "D.C." position of such switch. The output of the second amplifier 12 is connected to the output terminal 20 of the circuit and to one end of a feedback conductor 22 whose other end is connected to the input of the first amplifier 10 through a feedback resistor 24 and a switch 26 in the closed or "A.C. Stabilized" position of such switch. An A.C. bypass capacitor 28 is connected between ground and the common connection of resistor 24 and switch 26 in order to prevent any A.C. output signal from being transmitted through the feedback circuit from the outptut of amplifier 12 to the input of amplifier 10, thereby making such feedback circuit a negative D.C. voltage feedback circuit. Also the feedback circuit is bipolar since it is capable of transmitting positive and negative going signals.

The D.C. output voltage level at output terminal 20 may be adjusted by changing the setting of a movable contact on a resistance potentiometer 30, whose end terminals are connected to sources of positive and negative D.C. supply voltage "+B" and "−B" respectively. One output of the D.C. level adjustment potentiometer 30 is transmitted from the movable contact of such potentiometer through a coupling resistor 31 to the input of amplifier 12 to vary the D.C. output voltage of such amplifier. Another output from the potentiometer 30 is transmitted from its movable contact through a comparator resistor 32 to the common terminal 33 of feedback resistance 24 and bypass capacitor 28. The comparator resistor 32 transmits the D.C. level adjustment voltage produced on the movable contact of potentiometer 30 to the common terminal 33 in the feedback circuit, where it is added to the D.C. output voltage of amplifier 12 transmitted through feedback resistance 24. Amplifier 12 is a phase inverter amplifier so that the D.C. level adjustment voltage component of the output voltage of such amplifier is opposite in phase to that of the D.C. level adjustment voltage transmitted through comparator resistor 32. Thus these level adjustment voltages will cancel one another if they are of the same amplitude at terminal 33. A voltage dropping resistor 34 is connected between the common terminal 33 of resistors 24 and 32 and a negative D.C. supply voltage −B in order to reduce the positive quiescent D.C. voltage level at the output of amplifier 12 down to zero volts at common terminal 33.

It has been found that if the ratio of the feedback resistance 24 designated as $R_1$ divided by the comparator resistance 32 designated $R_3$ is approximately equal to the gain of the output amplifier 12 designated $G_2$, the voltage at the common terminal 33 does not vary with changes in the position of the movable contact of the D.C. level adjustment potentiometer 30. In other words, when $R_1/R_3=G_2$ the comparison level adjustment voltage transmitted through resistance 32 exactly cancels the feedback level adjustment voltage transmitted through resistance 24. As a result, the only feedback voltage transmitted to the input of the first amplifier 10 is equal to the drift voltage portion of the output voltage caused by temperature changes, aging, or by variation of the gain of such amplifier circuit. Any gain variation is accomplished by means of a variable resistance 36 gain adjustment control employed in the first amplifier 10. Preferably the second amplifier is not provided with a gain adjustment because this would require $R_1$ and $R_3$ to be varied accordingly to maintain the relationship $R_1/R_3=G_2$. It should be noted that the first amplifier 10 has a higher gain than that of the second amplifier 12, so that although a smaller drift feedback voltage is applied to the input of amplifier 10 due to the voltage divider action of resistances $R_1$, $R_2$ and $R_3$, the present circuit is able to correct for relatively large drifts in the output voltage. In addition, by inserting the D.C. level adjustment signal at the input of the second amplifier 12, the level adjustment potentiometer 30 provides a more precise control of the D.C. output voltage level of amplifier 12, since there is less amplification of such level adjustment voltage. As a result the amplifier circuit of the present invention operates over a more linear portion of its response characteristic and has a good high frequency response.

In addition to serving as an A.C. bypass, capacitor 28 also provides the feedback circuit with a relatively long time constant so that any short rise time step voltage input signal applied to input terminal 14 and transmitted through coupling capacitor 16 and amplifiers 10 and 12 as a differentiated spike pulse to output terminal 20, is not canceled by negative feedback. However, for D.C. or slowly varying A.C. input signals, the feedback circuit must be disconnected by opening switch 26 to the "Normal" position shown, since such input signal would be transmitted through the feedback circuit as a negative feedback voltage which would cancel the signal at output terminal 20. When switch 26 is open, switch 18 may be closed to the "D.C." position, short-circuiting coupling capacitor 16 to transmit D.C. input signals through amplifiers 10 and 12.

As shown in FIG. 2, a push-pull embodiment of the drift compensated amplifier circuit of the present invention used as the vertical deflection amplifier of a cathode ray oscilloscope is somewhat similar to that of the single ended embodiment of FIG. 1, so that the same reference numerals have been employed to designate like components. However, the circuit of FIG. 2 employs a pair of direct coupled push-pull amplifiers 10′ and 12′ with the outputs of amplifier 10′ connected to the inputs of amplifier 12′ and the outputs of the second amplifier 12′ connected to the vertical deflection plates of a cathode ray tube 38. Also the amplifier 12′ is not a phase inverter so its output signal on its upper output terminal is in phase with the input signal on its upper input terminal. In addition, the feedback circuit is provided with an additional feedback resistor 40 designated $R_4$ and connected between the ungrounded plate of capacitor 28 and the common terminal 33 of resistors 32, 34 and 24. This additional feedback resistor 40 provides the feedback circuit with a large RC time constant approximately equal to $R_4 \times C$, the capacitance of bypass capacitor 28. This series resistance $R_4$ eliminates the need for using impractically large values for resistances 32, 34 and 24 to provide the high RC time constant, due to the fact that the latter resistances are connected in parallel. Thus, in one embodiment of the present invention, feedback resistor 40 can be 10 megohms, while comparator resistor 32 is 300 kilohms, feedback resistor 24 is 2.2 megohms and voltage divider resistor 34 is 2.7 megohms. A capacitance of one microfarad is employed for capacitor 28, so that the RC time constant of the feedback circuit is about $R_4 \times C$ or 10 seconds, which is much larger than the effective RC time constant of coupling capacitor 16 and the input resistance of the amplifier. This means that the trailing edge of any spike-shaped output pulse produced by the differentiation of a step voltage pulse applied to one input of amplifier 10′ through input terminal 14 is transmitted to ground through bypass capacitor 28 and such trailing edge is not transmitted as part of the feedback signal through switch 26 to the other input of amplifier 10′. In addition, a second capacitor 42 of about 100 picofarads is connected in the feedback circuit between the common terminal 33 and ground for high frequency bypass.

The D.C. output voltage level adjustment circuit 30′ controls the vertical position of the trace on the fluorescent screen of a cathode ray tube 38 and includes a pair of resistance potentiometers 44 and 46 of 1 kilohm each, which are connected in parallel with their end terminals connected respectively to a source of negative D.C. supply voltage of −12.2 volts and ground. The movable contacts of potentiometers 44 and 46 are ganged and such potentiometers are cross-connected so that such movable contacts move together in opposite directions. Thus, when the movable contact of potentiometer 44 moves upward to a more negative voltage, the movable contact of potentiometer 46 moves upward toward a more positive voltage. The movable contact of potentiometer 44 is connected to the lower input terminal of amplifier 12′ through a coupling resistance 48 of 1.5 kilohms, while the movable contact of potentiometer 46 is connected to the upper input terminal of amplifier 12′ through a second coupling resistance 50 also of 1.5 kilohms.

In addition, one of the movable contacts of one of the potentiometers 44 and 46 is connected to the comparator resistor 32 and the feedback conductor 22 is taken from the output terminal of amplifier 12′ corresponding to the input terminal connected to the movable contact of the other potentiometer. Thus, as shown in FIG. 2, the movable contact of potentiometer 44 is connected to comparator resistor 32, while the upper output terminal of amplifier 12' is connected to the feedback resistor 24. This means that the positioning voltage component of the output voltage of push-pull amplifier 12' transmitted through the feedback conductor 22 is opposite in phase to the positioning voltage on the movable contact of potentiometer 44. Thus positioning voltage transmitted through comparator resistor 32 cancels that portion of the D.C. feedback voltage corresponding to such positioning voltage. This means that the remaining feedback voltage transmitted through resistor 40 to the lower input of amplifier 10' merely corrects for any drift caused by temperature variation, aging or variation of the setting of the gain control resistance 36', without canceling the vertical positioning voltage applied to the vertical deflection plates of the cathode ray tube. As a result of the above, the trace may be moved to any vertical position on the fluorescent screen of the cathode ray tube 38 by means of a positioning control circuit 30' and will be maintained stabilized in that position by the drift compensation feedback circuit.

In addition, a balance potentiometer 52 of 250 kilohms is provided with its movable contact connected to the fixed contact in the "Normal" position of switch 26 through a coupling resistor 54 of 250 kilohms, such fixed switch contact also being connected to ground through output resistor 56 of 1.8 kilohms. In the "Normal" position of switch 26 the feedback circuit is disconnected, in order to form a balanced paraphase amplifier out of amplifier 10'. The opposite end terminals of potentiometer 52 are respectively connected to a positive D.C. voltage source of +125 volts and a negative D.C. voltage source of −100 volts. The movable contact of potentiometer 52 is adjusted to apply a D.C. voltage to the lower input terminal of push-pull amplifier 10' in order to balance such amplifier so that an input signal applied to input terminal 14 is transmitted as a pair of output signals of equal amplitude and of opposite phase at the outputs of such amplifier. As stated previously, when the push-pull amplifier 10' is unbalanced, a current flows through the gain adjustment resistor 36' so that any change in the setting of such resistor varies the D.C. output voltage level of such amplifier as well as that of amplifier 12'. The resulting D.C. output voltage shift tends to cause the trace on the fluorescent screen of cathode ray tube 38 to move vertically but this is prevented by the drift compensation feedback circuit of the present invention. Large drift reductions have been achieved by the amplifier circuit of the present invention, such amplifier having up to 1000 times less drift than that of an uncompensated amplifier.

The operation of the positioning circuit and voltage comparator formed by resistors 24, 32 and 34 can be more clearly understood from the following description of one example. When it is desired to move the trace up above the center of the cathode ray tube screen, the movable contact of potentiometer 44 is moved upward to a more negative voltage and the movable contact of potentiometer 46 simultaneously moved to a more positive voltage. As a result a more positive D.C. voltage is applied to the upper vertical deflection plate and a more negative D.C. voltage is applied to the lower vertical deflection plate, which causes the negatively charged electron beam to move upward. There is no D.C. positioning signal current flowing in resistors $R_2$ or $R_4$ because the voltage at common terminal 33 is held constant and the lower input terminal of the input amplifier 10' is connected to the grid of a vacuum tube within such amplifier. Thus the positive-going positioning voltage $G_2V_p$ on the upper plate is transmitted to a signal ground point through feedback resistor 24 and comparator resistor 32, while the negative-going positioning voltage $-V_p$ produced on the movable contact of potentiometer is transmitted to signal ground through these same resistors 24 and 32. The portion of the positive-going positioning voltage produced across resistor 32 is $$G_2V_p \times \frac{R_3}{R_1+R_3}$$

which must be equal to but opposite in phase with the portion of the negative-going positioning voltage produced across feedback resistor 24 which is $$-V_p \times \frac{R_1}{R_1+R_3}$$

Therefore, if $$G_2V_p \times \frac{R3}{R1+R3} - V_p \times \frac{R1}{R1+R3}$$

or $R_1/R_3=G_2$ these two voltages cancel, so that the resulting change of voltage at the upper terminal of capacitor 28 is zero and there is no feedback voltage applied to amplifier 10' which might cancel the positioning voltage on the vertical deflection plates of tube 38.

However, any change in the D.C. output voltage on the upper vertical deflection plate due to drift is transmitted through the feedback conductor 22 and is stored on capacitor 28, for application to the lower input terminal of amplifier 10'. If this is a positive drift voltage it produces a negative correction voltage on the upper output terminal of amplifier 10', due to the phase inversion between the lower input terminal and the upper output terminal of such amplifier. This negative-going correction voltage is then transmitted to the upper output terminal of amplifier 12' to eliminate the positive drift in such output voltage. It should be noted that the negative D.C. supply voltage of −100 volts applied to resistance 34 compensates for the positive D.C. voltage applied to the upper deflection plate of the cathode ray tube to maintain the trace centered on its screen, so that the quiescent D.C. voltage of the common connection 33 of resistors 32 and 34 is zero when the movable contacts of potentiometers 44 and 46 are in their centered position, and there is no drift. Thus, the D.C. voltage level of the lower input terminal of amplifier 10' in the "D.C. Trace Stabilized" position of switch 26 is approximately 0 volt and no feedback voltage is applied to the lower input terminal of amplifier 10' unless the output voltage of amplifier 12' contains some drift voltage component.

It will be obvious to those having ordinary skill in the art that many changes may be made in the details of the above-described preferred embodiments of the present invention without departing from the spirit of the invention. For example, in place of the passive comparator circuit formed by resistors 24, 32 and 34, another comparator circuit having an active device, such as a vacuum tube or transistor, may be employed.

I claim:

1. A drift compensated amplifier circuit having an adjustable D.C. output voltage level, comprising:

a direct-coupled amplifier connected between input and output terminals of said circuit to provide an inverted output signal;

a bipolar feedback means capable of transmitting positive and negative going signals, connected between the output and the input of said amplifier to provide negative feedback for canceling any drift voltage component in the output voltage of said amplifier;

level adjustment means for adjusting the quiescent D.C. voltage level at the output of said amplifier; and comparator means included in said feedback means with one input connected to the output of said amplifier and another input conected to said level adjustment means and with its output connected to the input of the amplifier through the output of the feedback means, for comparing the level adjustment output voltage of said level adjustment means with the D.C. output voltage of said amplifier to produce a difference voltage output corresponding to said drift voltage and for applying said difference voltage to the input of said amplifier as the negative feedback signal which cancels said drift voltage without canceling said level adjustment voltage to maintain the selected D.C. output voltage level substantially constant.

2. A drift compensated amplifier circuit having an adjustable D.C. output voltage level, comprising:
- a first direct-coupled amplifier;
- a second direct-coupled amplifier having its input connected to the output of said first amplifier;
- a bipolar feedback means capable of transmitting positive and negative going signals, connected between the output of said second amplifier and the input of said first amplifier to provide negative feedback for canceling any drift voltage component in the output voltage of said second amplifier;
- level adjustment means connected to the input of said second amplifier for adjusting the quiescent D.C. voltage level at the output of said second amplifier; and
- comparator means included in said feedback means with one input connected to the output of said second amplifier and another input connected to said level adjustment means and with its output connected to the input of said first amplifier through the output of said feedback means, for comparing the level adjustment output voltage of said level adjustment means with the D.C. output voltage of said second amplifier to produce a difference voltage output corresponding to said drift voltage and for applying said difference voltage to the input of said first amplifier as a negative feedback signal which cancels said drift voltage without canceling said level adjustment voltage.

3. A drift compensated amplifier circuit having an adjustable D.C. output voltage level, comprising:
- a first direct-coupled amplifier;
- a second direct-coupled amplifier having its input connected to the output of said first amplifier;
- a bipolar feedback means capable of transmitting positive and negative going signals, connected between the output of said second amplifier and the input of said first amplifier to provide negative feedback for canceling any drift voltage component in the output voltage of said second amplifier, said feedback means including an A.C. bypass capacitor connected to ground;
- level adjustment means for applying a D.C. level adjustment voltage to one of the amplifiers to adjust the quiescent D.C. voltage level at the output of said second amplifier, said level adjustment voltage being opposite in phase to the output voltage of said second amplifier; and
- comparator means included in said feedback means with one input connected to the output of said second amplifier and another input connected to said level adjustment means and with its output connected to the input of said first amplifier through the output of said feedback means, for adding the level adjustment output voltage and the D.C. output voltage of said second amplifier to produce a difference voltage output corresponding to said drift voltage and for applying said difference voltage to the input of said first amplifier as a negative feedback signal which cancels said drift voltage without canceling said level adjustment voltage.

4. A drift compensated amplifier circuit having an adjustable D.C. output voltage level, comprising:
- a first direct-coupled amplifier;
- a second direct-coupled amplifier having its input connected to the output of said first amplifier;

- a bipolar feedback means capable of transmitting positive and negative going signals, connected between the output of said second amplifier and the input of said first amplifier to provide negative feedback for canceling any drift voltage component in the output voltage of said second amplifier, said feedback means including an A.C. bypass capacitor having one terminal connected to ground and a resistance connected between the other terminal of said capacitor and the output of said second amplifier;
- level adjustment means connected to the input of said second amplifier, for adjusting the quiescent D.C. voltage level at the output of said second amplifier; and
- comparator means included in said feedback means with one input connected to the output of said second amplifier and another input connected to said level adjustment means and with its output connected to the input of said first amplifier through the output of said feedback means, for comparing the level adjustment output voltage of said level adjustment means with the D.C. output voltage of said second amplifier to produce a difference voltage output corresponding to said drift voltage and for applying said difference voltage to the input of said first amplifier as a negative feedback signal which cancels said drift voltage without canceling said level adjustment voltage.

5. A drift compensated direct-coupled amplifier circuit having an adjustable D.C. output voltage level, comprising:
- a first direct-coupled push-pull amplifier having a pair of inputs with at least one input connected as the input terminal of said circuit;
- a second direct-coupled push-pull amplifier having a pair of inputs connected to the outputs of said first amplifier and having a pair of outputs adapted to be connected to the output terminals of said circuit;
- a bipolar negative feedback circuit capable of transmitting positive and negative going signals, connected between one of the outputs of said second amplifier and an input of said first amplifier, for canceling any drift voltage component in the output voltage of said second amplifier;
- D.C. output voltage level control means connected to the input of said second amplifier, for applying D.C. level adjustment voltages of opposite phase and the same magnitude to the inputs of said second amplifier;
- comparator means having one input terminal connected to an output of said second amplifier, having a second input terminal connected to the output of said level control means and having an output terminal connected to an input of said first amplifier through the output of said feedback circuit; and
- an A.C. bypass capacitor connected between the output of said comparator means and ground to prevent any A.C. signal from being transmitted through said feedback circuit.

6. A drift compensated direct-coupled amplifier circuit having an adjustable D.C. output voltage level, comprising:
- a first direct-coupled push-pull amplifier having a pair of inputs with at least one input connected as the input terminal of said circuit;
- a second direct-coupled push-pull amplifier having a pair of inputs connected to the outputs of said first amplifier and having a pair of outputs adapted to be connected to the output terminals of said circuit;
- a negative feedback circuit connected between one of the outputs of said second amplifier and the other input of said first amplifier, for canceling any drift voltage component in the output voltage of said second amplifier;
- D.C. output voltage level control means connected to the inputs of said second amplifier, for applying D.C. level adjustment voltages of opposite phase and the same magnitude to the inputs of said second amplifier;

comparator means having a first input including a first resistance provided in said feedback circuit and having one terminal connected to an output of said second amplifier, a second resistance connected between the other terminal of said first resistance and a source of D.C. supply voltage, a second input including a third resistance connected between the common terminal of said first and second resistances and said level control means, said common terminal being the summation point of the comparator and connected as the output of said comparator means through the output of the feedback circuit; and an A.C. bypass capacitor connected between feedback circuit and ground to prevent any A.C. signal from being transmitted through said feedback circuit.

7. A drift compensated vertical amplifier circuit for a cathode ray oscilloscope having an adjustable vertical positioning control, comprising:

a first direct-coupled push-pull amplifier having a pair of inputs with one input connected as the input terminal of said circuit;

a second direct-coupled push-pull amplifier having a pair of inputs connected to the outputs of said first amplifier and having a pair of outputs adapted to be connected to the vertical deflection means of the cathode ray tube in said oscilloscope;

a negative D.C. voltage feedback circuit connected between one of the outputs of said second amplifier and the other input of said first amplifier, for canceling any drift voltage component in the output voltage of said second amplifier;

vertical positioning control means including a pair of parallel potentiometers having their opposite ends connected to sources of D.C. supply voltage and having their movable contacts ganged so when one movable contact is moved to a more positive voltage the other movable contact is moved to a more negative voltage, and having said movable contacts connected to different ones of the inputs of said second amplifier, for applying D.C. positioning voltages of opposite phase and the same magnitude to the inputs of said second amplifier;

comparator means having a first input including a first resistance provided in said feedback circuit and having one terminal connected to an output of said second amplifier, a second resistance connected between the other terminal of said first resistance and a source of D.C. supply voltage, a second input including a third resistance connected between the common terminal of said first and second resistances and the movable contact of the one of said potentiometers at the input of the second amplifier which is opposite in phase to said one output of said second amplifier, and a fourth resistance connected between said common terminal and the other input of said first amplifier, said common terminal being the summation point of the comparator and connected as the output of said comparator means through the output of the feedback circuit; and an A.C. bypass capacitor connected between said fourth resistance in said comparator means and ground to prevent any A.C. signal from being transmitted through said feedback circuit.

8. A drift compensated vertical amplifier circuit for a cathode ray oscilloscope having an adjustable vertical positioning control, comprising:

a first direct-coupled push-pull amplifier having a pair of inputs with one input connected as the input terminal of said circuit and having a gain adjustment control;

a second direct-coupled push-pull amplifier having a pair of inputs connected to the outputs of said first amplifier and having a pair of outputs adapted to be connected to the vertical deflection means of the cathode ray tube in said oscilloscope;

a negative D.C. voltage feedback circuit including a switch connected between one of the outputs of said second amplifier and the other input of said first amplifier in one position of said switch, for canceling any drift voltage component in the output voltage of said second amplifier;

a balance potentiometer having its movable contact connected to said other input of said first amplifier in another position of said switch which opens said feedback circuit;

vertical positioning control means including a pair of parallel potentiometers having their opposite ends connected to sources of D.C. supply voltage and having their movable contacts ganged so when one movable contact is moved to a more positive voltage the other movable contact is moved to a more negative voltage, and having said movable contacts connected to different ones of the inputs of said second amplifier, for applying D.C. positioning voltages of opposite phase and the same magnitude to the inputs of said second amplifier;

comparator means including a first resistance in said feedback circuit having one terminal connected to an output of said second amplifier, a second resistance connected between the other terminal of said first resistance and a source of D.C. supply voltage, a third resistance connected between the common terminal of said first and second resistances and the movable contact of one of said potentiometers at the input which is opposite in phase to said one output of said second amplifier, and a fourth resistance connected between said common terminal and the other input of said first amplifier; and a pair of A.C. bypass capacitors connected between ground and the opposite ends of said fourth resistance in said comparator means to prevent any A.C. signal from being transmitted through said feedback circuit.

References Cited

UNITED STATES PATENTS

| | | | |
|---|---|---|---|
| 2,685,620 | 8/1954 | Nixon | 330—130 |
| 3,133,242 | 5/1964 | Harries | 323—22 |
| 3,167,718 | 1/1965 | Davis et al. | 330—9 X |

NATHAN KAUFMAN, *Primary Examiner.*

U.S. Cl. X.R.

330—83, 98, 130